(12) United States Patent
Yi et al.

(10) Patent No.: US 8,701,753 B2
(45) Date of Patent: Apr. 22, 2014

(54) METHOD AND APPARATUS FOR COOLING A PLANAR WORKPIECE IN AN EVACUATED ENVIRONMENT WITH DYNAMICALLY MOVEABLE HEAT SINKS

(75) Inventors: Chang Bok Yi, Fremont, CA (US);
Tatsuru Tanaka, Campbell, CA (US);
Paul Mcleaod, Berkeley, CA (US)

(73) Assignee: Seagate Technology LLC, Cupertino, CA (US)

( * ) Notice: Subject to any disclaimer, the term of this patent is extended or adjusted under 35 U.S.C. 154(b) by 2094 days.

(21) Appl. No.: 10/849,848

(22) Filed: May 21, 2004

(65) Prior Publication Data
US 2004/0250996 A1     Dec. 16, 2004

Related U.S. Application Data

(60) Provisional application No. 60/477,858, filed on Jun. 11, 2003.

(51) Int. Cl.
F28F 13/00    (2006.01)
F28F 13/08    (2006.01)
F28F 23/00    (2006.01)

(52) U.S. Cl.
USPC .............. 165/275; 165/86; 165/96; 165/80.1; 165/80.2; 165/80.4; 165/80.5; 165/104.33; 165/185; 118/724; 118/725; 118/729; 204/298.09

(58) Field of Classification Search
USPC .............. 165/80.1, 80.2, 80.3, 80.4, 80.5, 86, 165/275, 96, 104.33, 185; 118/724, 725, 118/729; 204/298.09
See application file for complete search history.

(56) References Cited

U.S. PATENT DOCUMENTS

| | | | |
|---|---|---|---|
| 3,566,960 A | 3/1971 | Stuart | |
| 5,181,556 A | 1/1993 | Hughes | |
| 5,287,914 A | 2/1994 | Hughes | |
| 6,209,220 B1 * | 4/2001 | Raaijmakers | 34/66 |
| 6,250,374 B1 * | 6/2001 | Fujino et al. | 165/80.1 |

* cited by examiner

Primary Examiner — John Ford (57) ABSTRACT

An apparatus and method for cooling a planar workpiece, such as a substrate of a recording disk, in an evacuated environment has a heat exchanging structure with at least two heat sinks having substantially parallel facing surfaces disposed within a vacuum chamber. A drive arrangement is connected to the heat sinks to controllably and dynamically drive the parallel facing surfaces of the heat sinks towards and away from each other.

20 Claims, 8 Drawing Sheets

METHOD AND APPARATUS FOR COOLING A PLANAR WORKPIECE IN AN EVACUATED ENVIRONMENT WITH DYNAMICALLY MOVEABLE HEAT SINKS

RELATED APPLICATIONS

This application claims priority to Provisional Application 60/477,858, filed on Jun. 11, 2003, the entire contents of which are hereby incorporated by reference.

FIELD OF THE INVENTION

The present invention relates to the manufacture of planar workpieces or other articles, including recording disks, and more particularly, to systems and methods for cooling the workpieces during the manufacturing process.

BACKGROUND OF THE INVENTION

Thin substrates, such as those used for magnetic disks, normally require high vacuum processing. This processing generally involves heating of the substrate to a desired temperature and applying different coatings by sputtering or similar physical vapor deposition processes. The high vacuum processes facilitate very high polarity coating depositions and the achievement of a variety of properties that are controlled by such parameters as background pressure, coating rate, and substrate temperature.

Control of substrate temperature in an evacuated environment (i.e., vacuum) is an important task. Typically, heating of a substrate is performed by radiation transfer from such devices as quartz lamps. However, normal heat conduction processes work very poorly in the vacuum environment. The atmosphere is not present to supply an ambient environment around the heat sink.

During substrate (or disk) processing, it is also often desirable to lower the substrate temperature. For example, controlled cooling of the substrate may be necessary to achieve a desired temperature for a serial coating step, such as chromium, cobalt alloy or carbon layers with magnetic disks. In this instance, the properties of the high hardness, abrasion resistant carbon coatings are enhanced when deposited onto a substrate which is at a relatively low temperature.

Further, cooling of substrates or disks by exposure to the atmosphere while still hot severely limit the usefulness of such substrates or disks for particular applications. Additionally, uncontrolled cooling and/or cooling in atmosphere can adversely affect coating quality by virtue of the diffusion of different coatings at elevated temperature.

Some prior art techniques to cool the relatively thin substrates during processing have used a heat exchanging body designed and configured to be in contact with the article to be cooled. The main disadvantage of such a system is that the act of touching such a relatively thin substrate may do harm to one or more surfaces that have to be maintained in pristine condition. Further, the low mass and the need to handle the substrates only at their edges make them difficult to conductively couple with a heat sink.

To overcome these problems, certain systems have been created to cool thin substrates without any contact to either surface. In these systems, a cooling chamber is provided with stationary heat sinks spaced a predetermined distance apart. The substrate is positioned between these stationary heat sinks and a high thermal conductivity gas is then introduced, filing the entire chamber to the desired operating pressure. The substrate is then cooled to a given temperature, depending on the heat sink temperature, original substrate temperature, gas thermal conductivity, pressure, and spacing between the substrate and heat sinks.

However, the process steps of multiple thin film depositions and heating substrates have been changed to employ higher target temperatures before cooling. Furthermore, newer products have thicker substrates and require higher cooling rates before an overcoat process. Providing the required cooling for such products will lower the production rate per hour compared to that achieved in processing of older products using current cooling techniques. Therefore, an improved cooling system is needed to meet the overcoat process specification with a higher throughput.

SUMMARY OF THE INVENTION

There is a need for a system which provides improved cooling of workpieces, such as disks, during the manufacturing process to continue to provide a high throughput without damaging the workpieces.

These and other needs are met by embodiments of the present invention which provide an apparatus for cooling a planar workpiece in an evacuated environment, comprising a heat exchanging structure having at least two heat sinks with substantially parallel facing surfaces disposed within a vacuum chamber. The apparatus also comprises a drive arrangement connected to the heat sinks to controllably drive the parallel facing surfaces of the heat sinks towards and away from each other.

In a gas conduction cooling process, the energy removed from the disk in a given time period is dependent on the spacing between the workpiece and the heat sink. Conventional systems employ a predetermined spacing between the heat sinks. This allows the workpiece to be inserted between the heat sinks and the cooling gas is able to flow through the space between the heat sink and the workpiece. Due to the stationary nature of these heat sinks, the spacing needs to be large enough to assuredly prevent the substrate or workpiece from contacting the heat sink during the insertion and removal of the workpiece between the heat sinks. Hence, the margin required for the insertion and removal process of the workpiece prevents an optimum spacing from being employed during the actual cooling, thereby preventing a higher cooling rate. The present invention overcomes this limitation by providing a drive arrangement that controllably drives the parallel facing surfaces of the heat sinks towards and away from each other. With this feature, the heat sinks can be positioned with a larger spacing therebetween to allow for the insertion and removal of a workpiece to be cooled. Once the workpiece is inserted between the spaced apart heat sinks, the drive arrangement is able to controllably drive the surfaces of the heat sinks towards each other to reduce the distance between the surfaces of the heat sinks and the surfaces of the workpiece. A reduction in distance between the heat sinks and the workpiece increase the rate of cooling, allowing the production throughput to remain relatively high, even with greater cooling rate demands required by thicker workpieces.

The earlier stated needs are met by other embodiments and aspects of the present invention which include an apparatus for cooling a planar workpiece in an evacuated environment, comprising a heat exchanging structure having at least two heat sinks with substantially parallel facing surfaces disposed within a vacuum chamber and having a spacing therebetween to admit a workpiece, and means for dynamically adjusting the spacing between the substantially parallel facing surfaces during operation of the apparatus.

The earlier stated needs are met by still further aspects of the present invention which comprise a method for cooling an article having opposite substantially planar outer surfaces in an evacuated environment. This method comprises the steps of spacing a pair of heat sinks having substantially planar parallel facing surfaces a first distance apart. The heat sinks are operatively mounted within a processing chamber. The first distance permits the insertion and removal of the article therebetween without contact with the heat sinks. The method further comprises positioning the article between the spaced heat sinks so that the respective outer surfaces of the article are adjacent to and substantially parallel with the facing surfaces of the heat sinks. The pair of heat sinks are subsequently moved to reduce the spacing between the heat sinks to a second distance less than the first distance. This forms a separation between the facing surfaces of the heat sinks and the outer surfaces of the article. Cooling gas is then introduced in the separation between the facing surfaces of the heat sinks and the outer surfaces of the article.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the cooling of workpieces and articles, such as substrates for recording disks, in an evacuated environment. In particular, the present invention solves problems, at least in part, related to the need for increased cooling rate to either improve throughput by increasing the cooling rate, or maintaining the throughput for substrates having greater thicknesses. This is achieved, in part, by methods and apparatus for cooling a workpiece in an evacuated environment in which a drive arrangement is provided to controllably drive the parallel surfaces of the heat sinks towards and away from each other. This allows for the heat sinks to be spaced a greater distance apart to permit insertion of the workpiece between the heat sinks, without damage to the heat sinks, followed by driving the heat sinks closer to the surfaces of the workpiece for the cooling process itself. By careful positioning, the gap between the surfaces of the heat sinks and the surfaces of the workpiece may be made more narrow than when the heat sinks are stationary, in a production environment. Narrowing the spaces between the surfaces of the heat sinks and the surfaces of the workpiece allows for an increase in the cooling rate and improvements in the throughput of the workpieces.

Gas conduction cooling can be viewed with a simple model as per the following:

$$\frac{\Delta E}{\Delta t} = K\left(\frac{\Delta \phi}{L}\right)$$

$\Delta E$=energy removed from the disk
$\Delta t$=time increment
$K$=gas thermal conductivity
$\Delta\phi$=temperature difference between substrate and heat sink
$L$=spacing between substrate and heat sink For most gases the thermal conductivity K is constant at pressures of one atmosphere and higher, with little or no dependency on the pressure. As the pressure falls below an atmosphere, the conductivity is reduced. The conductivity of the various gases is related to their molecular weight, with the lightest gases, such as helium and hydrogen, being the best conductors.

Figure 1:
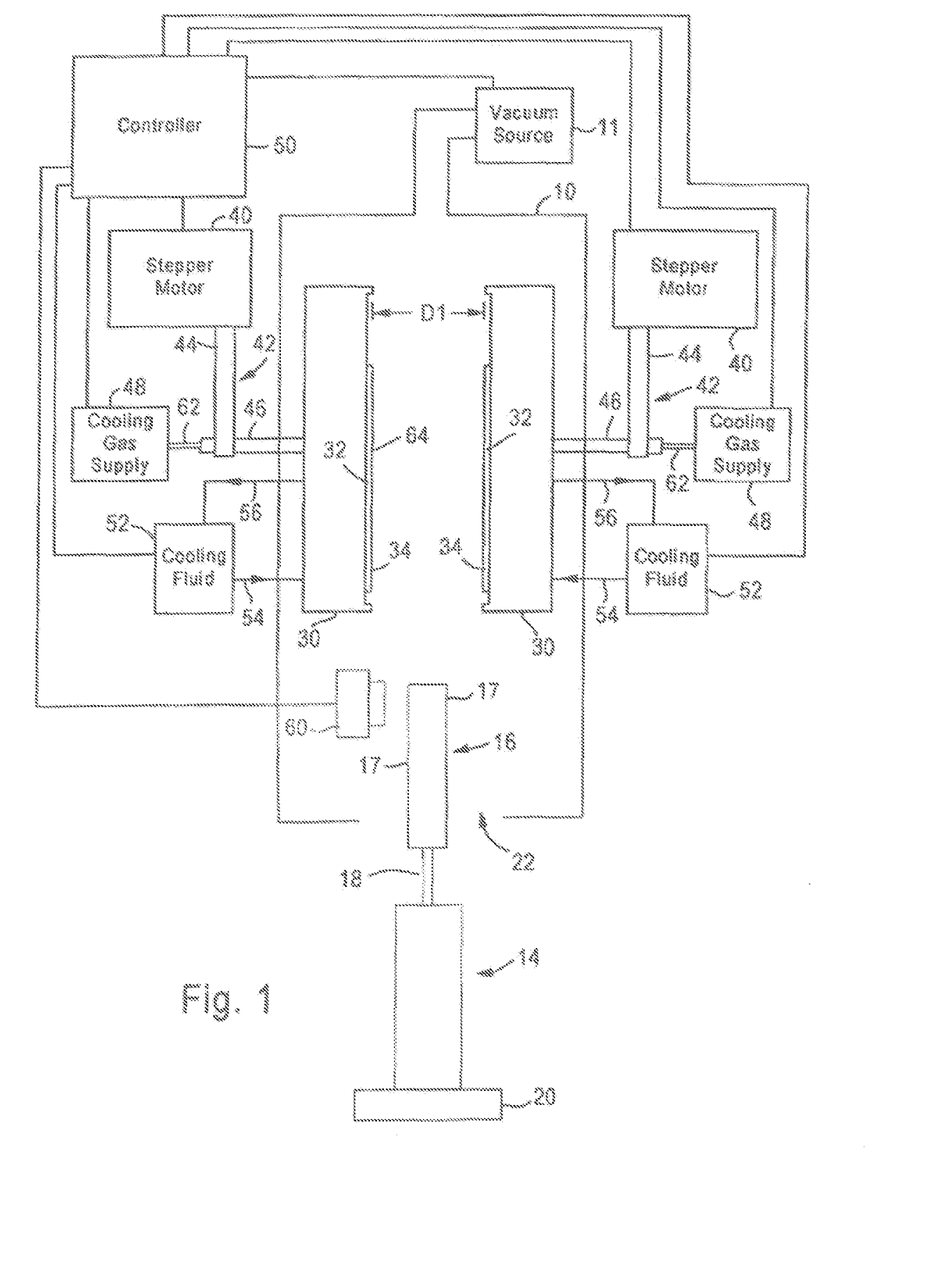
FIG. 1 is a schematic cross-sectional side view of a cooling system apparatus constructed in accordance with embodiments of the present invention.

FIG. 1 is a simplified sectional view of an embodiment of the present invention. In preferred embodiments of the invention, the cooling chamber 10 is operatively connected to a source of vacuum 11. A pressure of approximately $10^{-7}$ to approximately $10^{-8}$ torr is produced in the chamber 10 by the vacuum source 11.

A carousel arm 14, forming part of a carousel to carry the articles or workpieces, is depicted in FIG. 1. In the following description, the workpieces are assumed to be substrates for magnetic recording disks or other types of recording disks. However, it should be recognized that the invention is not limited to the cooling of such substrates, but may be applied to that of other types of workpieces or articles.

The carousel arm 14 carries a disk 16 in a disk holder 18 in a conventional manner. The disk 16 has disk surfaces 17 (also referred to as outer planar surfaces of the workpiece or article or disk). A seal opening 22 is provided, through which the disk 16 is inserted by the carousel arm 14. The bottom of the carousel arm 14 has a seal 20 that seals the seal opening 22 when the disk 16 is fully inserted. This seals chamber 10 and a high vacuum can be achieved by the high vacuum source 11.

A pair of heat sinks 30, made of a suitable conductive material such as copper, are provided within the chamber 10. The heat sinks 30 include a cooling plate 32, also formed of a highly conductive material for better heat transfer. The cooling plates 32 have substantially parallel facing surfaces 34. A first distance D1 separates the surfaces 34 of the heat sinks 30 (i.e., the cooling plates 32). As will be described in more detail later, the cooling plates 32 are interchangeable to match the substrates being cooled, to provide a maximum cooling surface for heat exchange. The first distance D1 is such that a disk 16 can be safely inserted without fear of unintentional damage to the disk 16 during the insertion process. During removal of the disk 16 from the chamber 10, the heat sinks 30 are again moved to a position in which they are separated by the first distance D1, again providing for safe handling of the disk 16.

The movement of the heat sinks 30 and cooling plates 32 is achieved by a drive arrangement under the control of a controller 50. In one embodiment, the controller 50 may be implemented with a programmable logic controller (PLC). One exemplary PLC (FX1N-14-MT-ESS/UL) and associated analog adapter board (FX1N-2AD-BD) are commercially available from Mitsubishi®. As is well known in the art, PLCs are programmed with commercially available programming software such as FX-PCS/WIN. The drive arrangement, also seen in isolation in FIGS. 4 and 5, includes a pair of stepper motors 40, whose motions are precisely controlled by the controller 50. In one embodiment, the pair of stepper motors 40 may be implemented with 5 phase stepping motor/drivers (CSK596-NBTA) commercially available from VEXTA®. The output of the stepper motors 40 are provided to a stepper motor output gear 44, whose rotational movements are translated into a linear motion by a gear rack 46. Each heat sink 30 is connected to a respective gear rack 46, and thus is moved in a linear direction by a precise amount. Thus, each heat sink 30 may be moved in a linear direction to achieve either a first distance D1 between the heat sinks 30 or a second distance D2 between the heat sinks 30 as discussed in more detail below.

A proximity sensor 60 is provided in the chamber 10 to sense the proximity of the carousel arm 14. In one embodiment, the proximity sensor 60 may be implemented with an inductive displacement sensor, such as the sensor head (EX-022, 10MM range)/controller (EX-510) assembly commercially available from KEYENCE®. The proximity sensor 60 thus provides precise position information regarding the disk 16 in an axial direction. The controller 50 and proximity sensor 60 are operable to detect when the carousel arm 14 and attached disk 16 are fully inserted into the chamber 10 by the proximity sensor 60 providing a position signal to the controller 50. Based upon this position signal, the controller 50 is able to precisely control the stepper motors 40 to position the heat sinks 30 and cooling plates 32 very close to the surfaces 17 of the disk 16, without contacting the disk surfaces 17 (i.e., from the first distance D1 to the second distance D2) when the carousel arm 14 and attached disk 16 are fully inserted into the chamber 10.

In operation, cooling gas is supplied from a cooling gas supply 48 through a conduit 62 in the gear rack 64 and into the chamber 10 through apertures in the cooling plate 32. The cooling gas may be any suitable cooling gas, such as helium or a helium and hydrogen mixture, for example. The heat sinks 30 are also provided with cooling fluid from a cooling fluid supply 52 that is provided through an inlet 54 and exits the heat sink 30 through an outlet 56. An example of cooling fluid is water, which may be provided at a temperature of between, for example, 1° C. to about 25° C., and preferably about 15° C. In previous systems, it was preferred to provide a refrigerant to cool the heat sinks to between about −50° C. and −200° C. by conventional cryogenic refrigeration. However, due to the increased cooling effect provided by the reduced space between the surfaces of the heat sink 30 and the surfaces 17 of the disk 16 during the cooling process, the use of chilled cooling water suffices to adequately cool the heat sinks 30. This results in a cost savings, as well as reduces maintenance and production issues.

Figure 2:
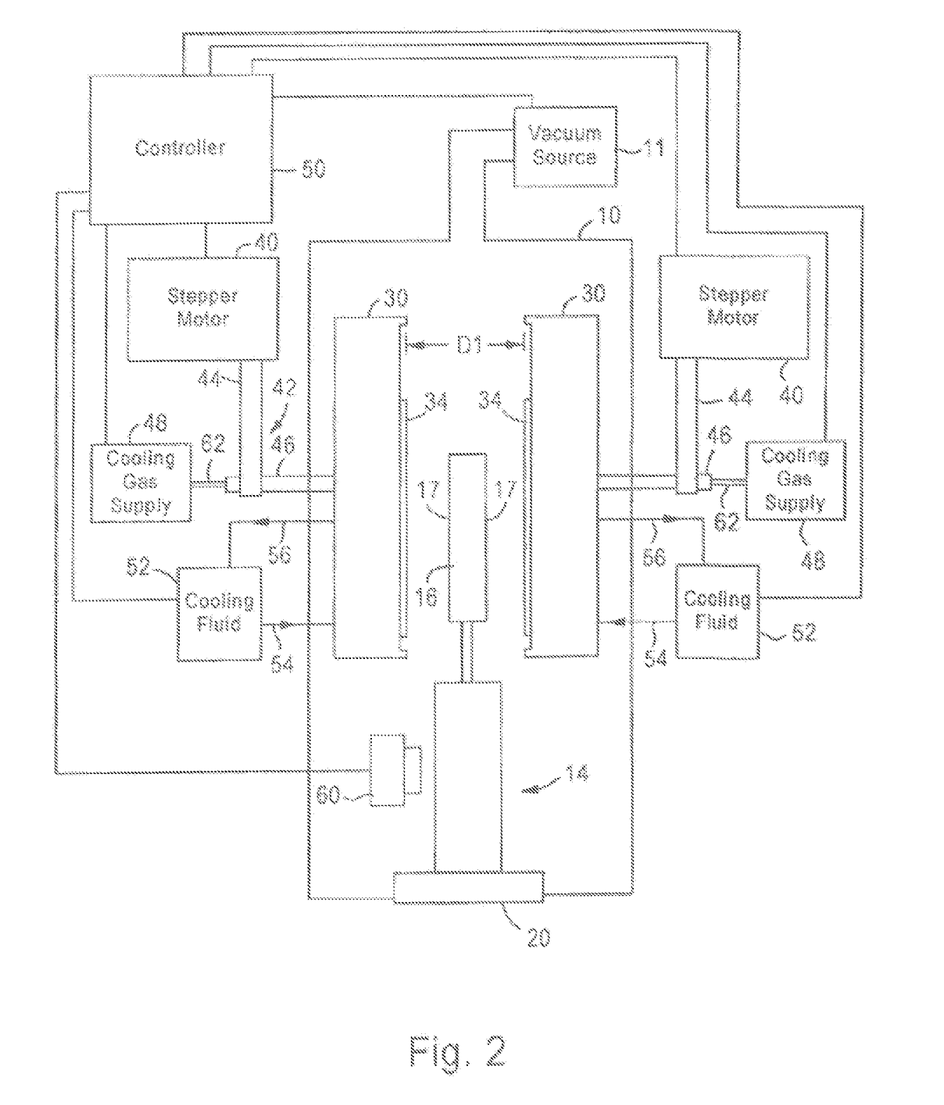
FIG. 2 depicts the structure of FIG. 1 following the insertion of a workpiece, such as a magnetic disk substrate, between the heat sinks, in accordance with methods of the present invention.

FIG. 2 depicts the structure of FIG. 1 following the complete insertion of the disk 16 into the chamber 10. The complete insertion of the disk 16 into the chamber 10, as discussed above, is detected by the proximity sensor 60. The parallel facing surfaces 34 are separated by the first distance D1 to provide easy insertion of the disk 16 between the facing surfaces of the heat sinks 30 (i.e., the cooling plates 32). The seal 20 engages the seal opening 22. The vacuum source 11 is controlled to provide a high vacuum within the chamber 10.

Since the heat sinks 30 are spaced by the first distance D1, damage to the disk 16 can be reliably avoided during insertion. A distance that is a compromise between the safety of the disk 16 and the cooling effect is therefore not necessary.

Figure 3:
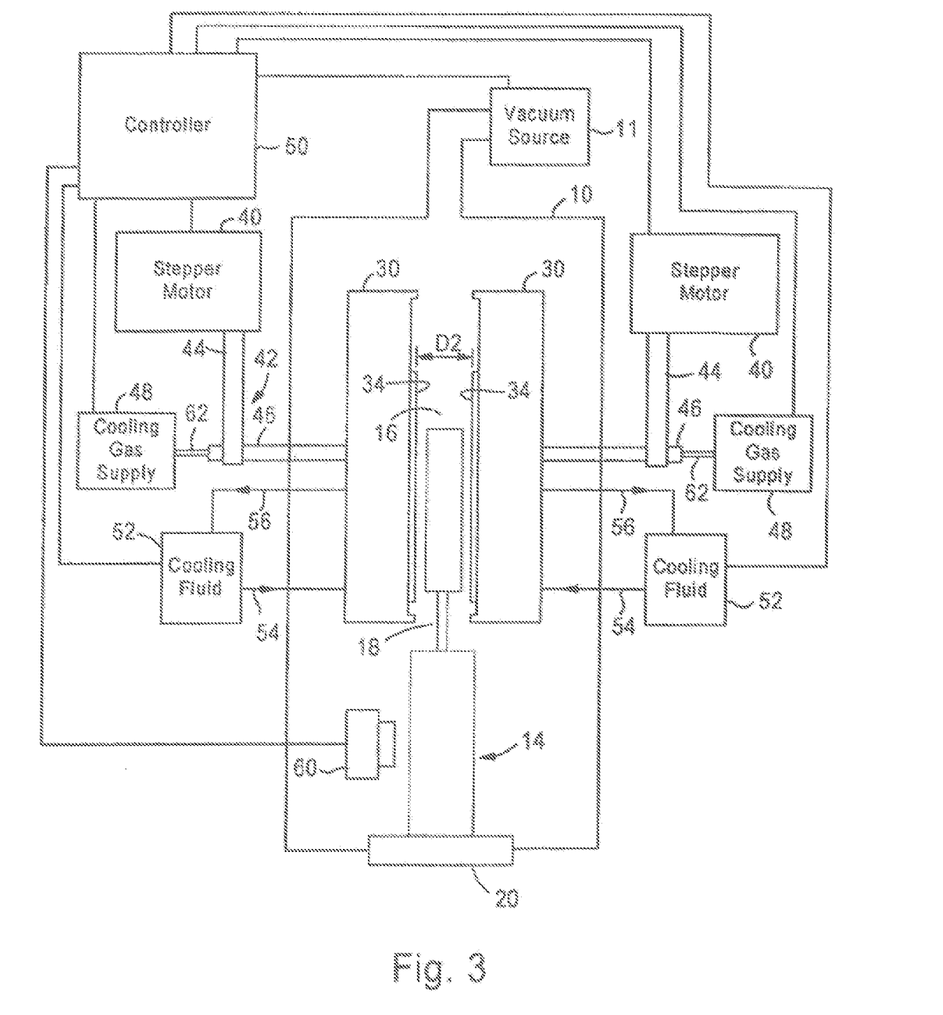
FIG. 3 shows the structure of FIG. 2 after the distance between the heat sinks are dynamically adjusted, and the cooling gas is introduced, in accordance with methods of the present invention.

In FIG. 3, based upon the position signal provided by the proximity sensor 60, the controller 50 is aware of the precise position of the disk 16 between the cooling plates 32 (e.g., when the carousel arm 14 and attached disk 16 are fully inserted into the chamber 10 and properly positioned between the heat sinks 30 and cooling plates 32). Using this position signal, as an actuation signal, the controller 50 precisely controls the stepper motors 40 to operate the gear arrangement 42 to drive the parallel facing surfaces 34 of the cooling plates 32 (i.e., of the heat sinks 30) towards each other and the surfaces 17 of the disk 16, to the second distance D2. Hence, a gap 36 between the facing surfaces of the heat sinks 30 and the surfaces 17 of the disk 16 may be minimized in a dynamic manner. That is, by moving the heat sinks 30 in a linear direction from the first distance D1 apart to the second distance D2 apart only when the disk 16 is safely inserted, allows the safe insertion of the carousel arm 14 and attached disk 16 when at the first distance D1 and yet an optimized minimal distance D2 during the cooling operation to improve efficiency. For example, employing the drive arrangement of the present invention, the gap 36 may be reduced to a distance of less than 50 mils (0.05"), and in certain preferred embodiments, approximately 30 mils (0.03"). This reduction in the gap 36 between the facing surface of the heat sink 30 and the surface 17 of the disk avoids the compromise spacing in the prior art where undesirable contact with the substrate surfaces is avoided, but only by compromising the heat transfer from the substrate to the heat sinks.

Once the heat sinks 30 are positioned as in FIG. 3 to be separated by a second distance D2, the cooling gas is introduced through the apertures 64 in the cooling plates 32. The gas flow is introduced and maintained at a pressure significantly above that of the processing chamber 10, yet substantially below that of the atmosphere. In certain embodiments of the invention, the gas pressure is maintained at approximately 1 to 100 torr, preferably approximately 10 torr. The cooling gas is provided from the cooling gas supply 48 through the conduit 62 of the gear rack 46 to the aperture 64 in the cooling plates 32. Since the cooling gas impinges directly on the surfaces 17 of the disk 16, the heat exchange ratio is increased in comparison to conventional arrangements.

To stop the cooling of the disk 16, the gas flow is stopped and the disk 16 is removed from the chamber 10 by the carousel arm 14. Prior to moving the disk 16, however, the controller 50 operates the stepper motors 40 to return the heat sinks 30 to the position occupied in FIG. 2, to be separated by the first distance D1. This allows for safe withdrawal of the disk 16 from between the heat sinks 30.

Figure 4:
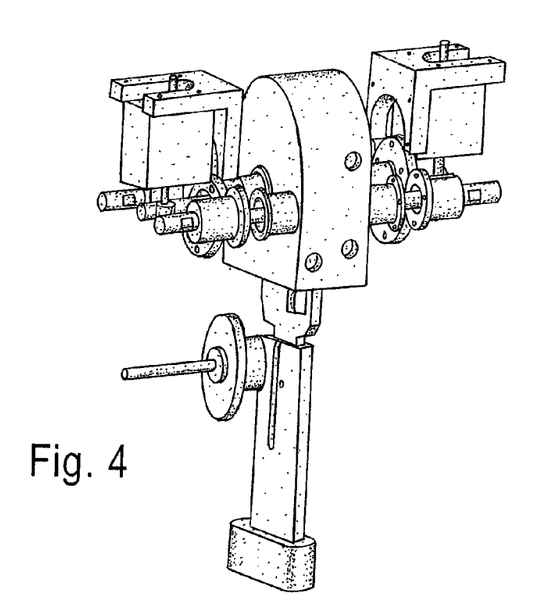
FIG. 4 depicts the drive mechanism shown in FIG. 1, in an isolated perspective view.
Figure 5:
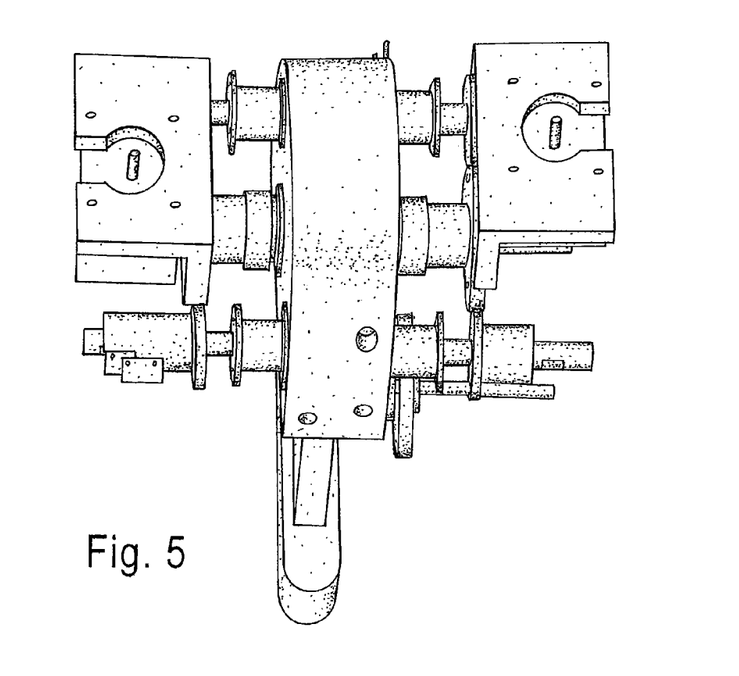
FIG. 5 shows the structure of FIG. 4 in a top, isolated perspective view.

FIGS. 4 and 5 depict the drive arrangement in isolation, along with the carousel arm 14. The proximity sensor 60 is depicted in FIG. 4, but not in FIG. 5.

Figure 6:
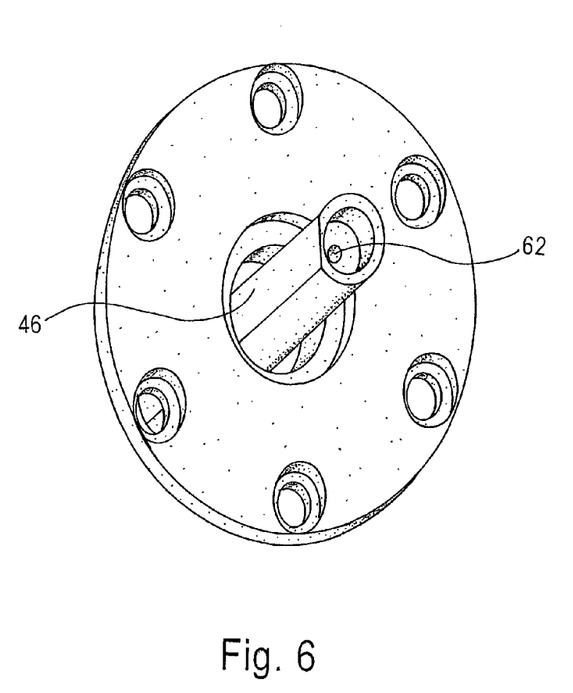
FIG. 6 is a perspective view of an integrated gear rack constructed in accordance with embodiments of the present invention, forming part of the drive mechanism of FIGS. 4 and 5.

FIG. 6 depicts the integrated gear rack 46 in accordance with embodiments of the present invention. The conduit 62 for the cooling gas may be seen in this Figure. The gear rack 46 has gearing that interacts with the output gear 44 from the stepper motor 40, to form the gear arrangement 42.

Figure 7:
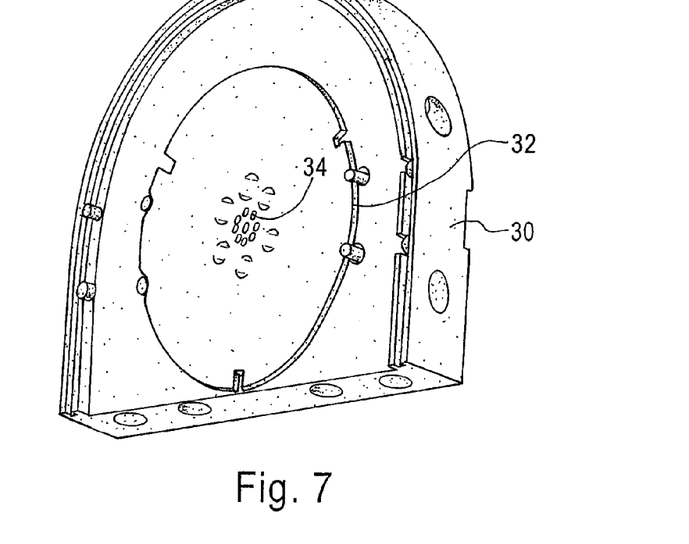
FIG. 7 is a perspective view of a heat sink with a cooling plate attached, in accordance with embodiments of the present invention.

FIG. 7 depicts the heat sink 30 with the cooling plate 32 attached. The heat sink 30 and the cooling plate 32 may be formed of copper, for example. The cooling plate 32 is advantageously shaped to have a matching design to that of the substrate, or workpiece, to be cooled. The cooling plate 32 may be attached to the heat sink 30 by any conventional fastener arrangement. The interchangeability of the cooling plates 32 allows for a cooling plate to be used that closely matches the size of the substrates to be cooled, and thereby increase cooling efficiency. The gas apertures 34 in the cooling plate 32 are more readily apparent in FIG. 7.

Figure 8:
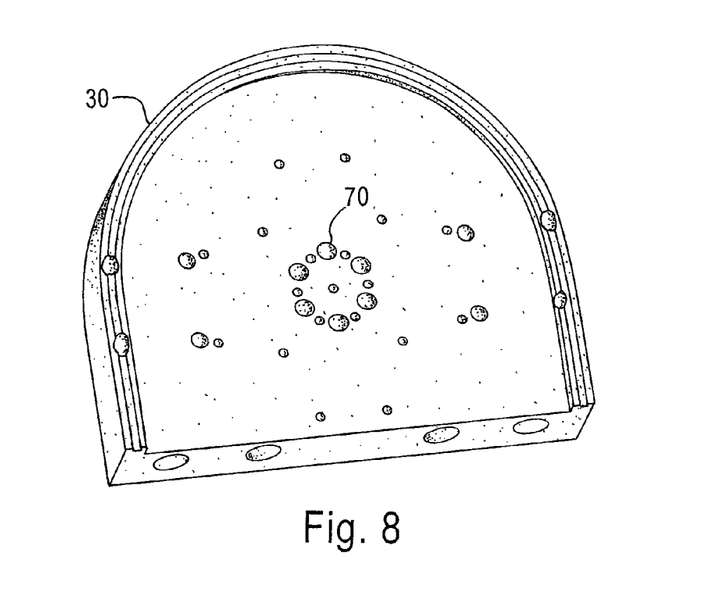
FIG. 8 depicts a heat sink without a cooling plate attached, in accordance with embodiments of the present invention.

FIG. 8 depicts the heat sink 30 without a cooling plate attached. Connecting apertures 70 provide for gas flow between the conduit 62 of the gear rack 46 and the gas apertures 34 of the cooling plate 32.

Figure 9:
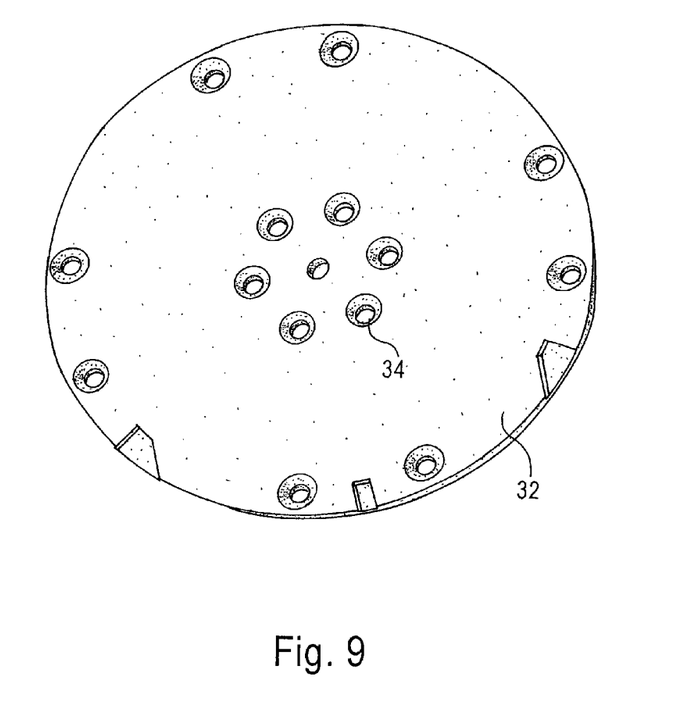
FIG. 9 depicts a cooling plate in isolation, in accordance with embodiments of the present invention.

FIG. 9 depicts the cooling plate 32 in isolation. As can be readily appreciated, the gas apertures 34 are distributed around the cooling plate 32. This provides an even distribution of the cooling gas onto the surface 17 of the disk 16. The number and arrangement of the gas apertures 34 depicted in the cooling plate 32 is exemplary only, as other arrangements may be provided without departing from the scope of the present invention.

Figure 10:
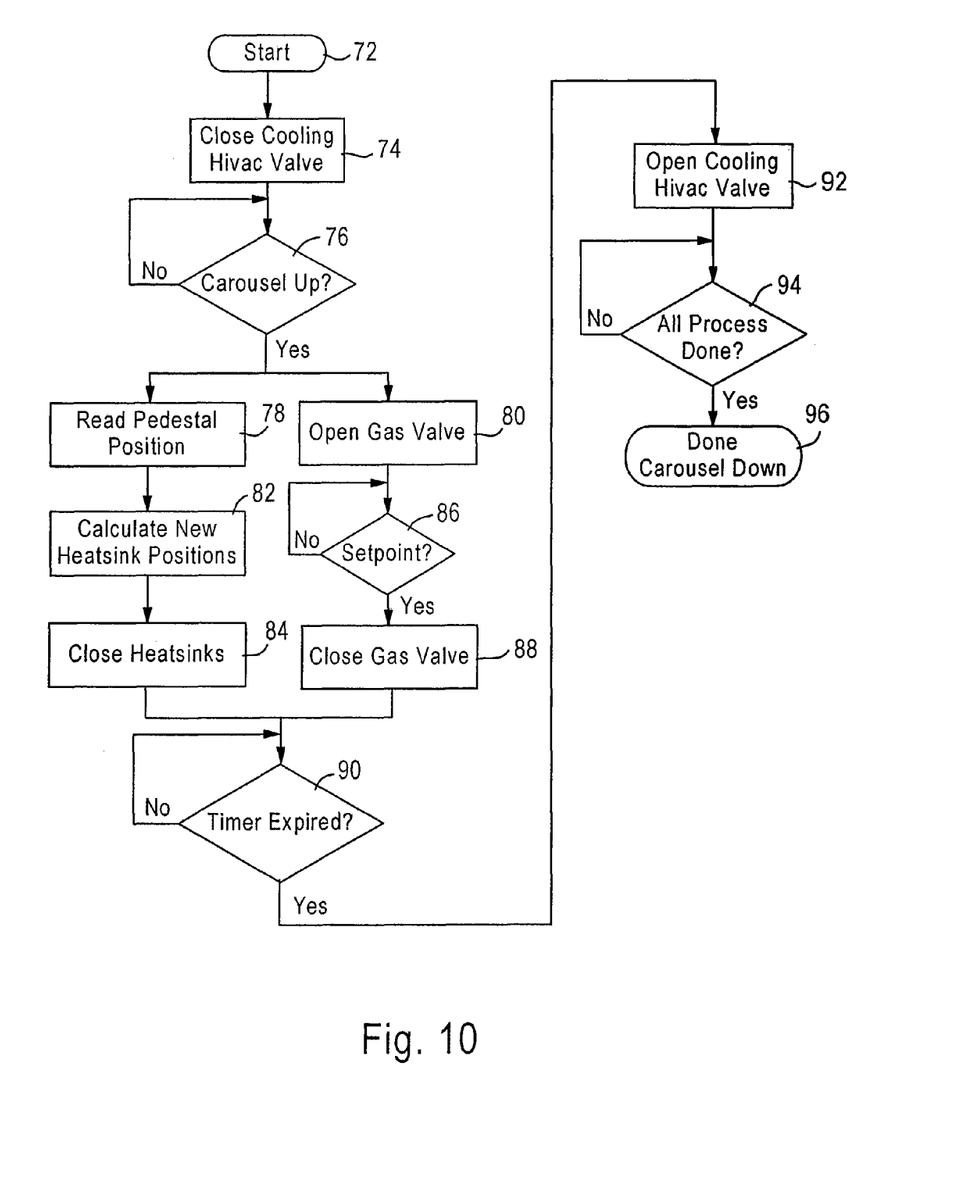
FIG. 10 is a flow chart depicting an exemplary operation process in accordance with methods of the present invention.

FIG. 10 depicts a flow chart showing a control of the process in accordance with embodiments of the present invention. From a start state 72, a high vacuum valve is closed in step 74, under the control of the controller 50. It is then determined in step 76 whether the carousel arm 14 is in the up position, such as that depicted in FIG. 2. If the carousel arm 14 is not yet up, the process waits until this occurs. Once the carousel arm 14 is detected as being in the up position, the process continues to steps 78 and 80.

In step 78, the pedestal (carousel arm 14) position is read by the proximity sensor 60. The controller 50 uses the position signal created by the proximity sensor 60 to calculate the new heat sink positions, as provided for in step 82. Controlling the stepper motors 40, the controller 50 closes the heat sinks 30 from the first, open position in which the heat sinks 30 are separated by the first distance D1 to a second position, the closed position, in which the heat sinks 30 are separated by the second distance D2. This occurs in step 84.

At the same time, the gas valve from the cooling supply source 48 is opened, as described in step 80. It is then determined in step 86 whether the temperature set point has been reached. In other words, it is determined whether the cooling process has sufficiently cooled the disk 16. Once the set point has been reached, the controller 50 closes the gas valve 88 to shut off the supply of the cooling gas. It is then determined in step 90 whether a timer has expired for the process. Once the timer has expired, the controller 50 opens the high vacuum valve for the cooling chamber 10 in step 92. It is then determined in step 94 whether all the processing is completed for all the disks in the various chambers of the carousel, as determined in step 94. Once all the processing is performed, the carousel arm 14 is moved down with the rest of the carousel, as provided for in step 96.

The stepper motors 40 and gear arrangement 42, along with the controller 50, provide the means for dynamically adjusting the spacing between the parallel facing surfaces 34 of the heat sink 30. This avoids the compromise in the heat sink spacing found in arrangements in which stationary heat sinks are provided. The dynamic adjustment of the spacing between the heat sinks in the present invention allows for reliable and safe insertion and removal of the substrate to be cooled without damage to the substrate, but minimizes the spacing once the substrate has been safely inserted between the heat sinks. This minimization of the spacing, beyond which is practically achievable with stationary heat sinks, reduces the cooling rate to allow for improved throughput, or maintenance of a given throughput with increased substrate thicknesses.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. An apparatus for cooling a planar workpiece in an evacuated environment, said apparatus comprising:
    a heat exchanging structure having at least two heat sinks with substantially parallel facing surfaces disposed within a vacuum chamber and having a first distance between the substantially parallel facing surfaces to admit a workpiece; and
    means for dynamically adjusting a distance between the substantially parallel facing surfaces during operation, such that the distance is dynamically adjusted to a second distance between the substantially parallel facing surfaces after the workpiece is positioned between the substantially parallel facing surfaces.

2. The apparatus of claim 1, wherein the means for dynamically adjusting includes a drive arrangement connected to the heat sinks to controllably drive the substantially parallel facing surfaces to one of the first and second distances between the substantially parallel facing surfaces.

3. The apparatus of claim 2, wherein the drive arrangement includes a controller, a pair of stepper motors controllably coupled to the controller, and gear arrangements operatively connected between the stepper motors and the heat sinks, such that actuation of the stepper motors causes the gear arrangements to drive the substantially parallel facing surfaces of the heat sinks to one of the first and second distances between the substantially parallel facing surfaces.

4. The apparatus of claim 3, wherein the controller is configured to drive the substantially parallel facing surfaces of the heat sinks to the second distance between the substantially parallel facing surfaces after a workpiece has been positioned between the substantially parallel facing surfaces, wherein each substantially parallel facing surface is separated from the workpiece by a distance of less than 50 mils.

5. The apparatus of claim 4, wherein each heat sink includes a cooling plate having gas apertures operable to open at the substantially parallel facing surface towards a workpiece, the gas apertures being connected via a cooling gas distribution channel to a cooling gas supply.

6. The apparatus of claim 5, wherein the controller is configured to supply the cooling gas via the cooling gas distribution channel and the gas apertures to between the parallel facing surface and the workpiece.

7. The apparatus of claim 6, wherein the cooling plates are removable from the heat sinks, and have an outer circumference substantially matching an outer circumference of the workpiece.

8. The apparatus of claim 3, further comprising a proximity sensor positioned to detect an axial position of a workpiece in relation to the heat sinks, and coupled to the controller to provide a workpiece position signal to the controller.

9. An apparatus for cooling a planar workpiece, comprising:
    a heat exchanging structure having at least two heat sinks with substantially parallel facing surfaces and having a first distance between the substantially parallel facing surfaces to admit a workpiece; and
    a drive arrangement configured to dynamically adjust a distance between the substantially parallel flat surfaces to a second distance after the workpiece is positioned between the substantially parallel facing surfaces.

10. The apparatus of claim 9, wherein the drive arrangement includes a controller, a pair of stepper motors controllably coupled to the controller, and gear arrangements operatively connected between the stepper motors and the heat sinks, wherein actuation of the stepper motors causes the gear arrangements to drive the substantially parallel facing surfaces of the heat sinks to one of the first and second distances between the substantially parallel facing surfaces.

11. The apparatus of claim 10, wherein the controller is configured to drive the substantially parallel facing surfaces of the heat sinks to the second distance between the substantially parallel facing surfaces after a workpiece has been positioned between the substantially parallel facing surfaces, such that each substantially parallel facing surface is separated from the workpiece by a distance of less than 50 mils.

12. The apparatus of claim 11, wherein each heat sink includes a cooling plate having gas apertures that are operable to open at the substantially parallel facing surface towards a workpiece, the gas apertures being connected via a cooling gas distribution channel to a cooling gas supply, wherein the controller is configured to supply the cooling gas via the cooling gas distribution channel and the gas apertures to between the parallel facing surface and the workpiece.

13. The apparatus of claim 12, wherein the cooling plates are removable from the heat sinks, and have an outer circumference substantially matching an outer circumference of the workpiece.

14. The apparatus of claim 10, further comprising a proximity sensor positioned to detect an axial position of a workpiece in relation to the heat sinks, and coupled to the controller to provide a workpiece position signal to the controller.

15. An apparatus for cooling a planar workpiece, comprising:
a cooling chamber;
a pair of heat sinks in the cooling chamber with substantially parallel facing surfaces and having a first distance between the substantially parallel facing surfaces to admit the workpiece;
a proximity sensor positioned in the cooling chamber and configured to produce sensed position information regarding the axial position of the workpiece between the substantially parallel facing surfaces; and
a drive arrangement configured to dynamically adjust a distance between the substantially parallel flat surfaces to a second distance after the workpiece is positioned between the substantially parallel facing surfaces as determined by the proximity sensor.

16. The apparatus of claim 15, wherein the drive arrangement includes:
a controller;
a pair of stepper motors controllably coupled to the controller; and
gear arrangements respectively operatively connected between the stepper motors and the heat sinks, such that actuation of the stepper motors causes the gear arrangements to drive the parallel facing surfaces of the heat sinks to one of the first and second distances between the substantially parallel facing surfaces.

17. The apparatus of claim 16, wherein each heat sink includes a cooling plate, each cooling plate having gas apertures extending therethrough, opening at the parallel facing surfaces.

18. The apparatus of claim 17, further comprising fasteners that attach the cooling plates to the heat sinks.

19. The apparatus of claim 18, wherein the cooling plates have an outer circumference that substantially matches an outer circumference of the planar workpiece.

20. The apparatus of claim 19, wherein each gear arrangement includes a gear rack coupled to a respective one of the heat sinks, each gear rack including an integrated cooling gas distribution channel connecting the gas apertures to a cooling gas supply.

* * * * *